(12) United States Patent
Lee et al.

(10) Patent No.: US 9,899,409 B2
(45) Date of Patent: Feb. 20, 2018

(54) NONVOLATILE MEMORY DEVICE HAVING PAD STRUCTURE FOR HIGH SPEED OPERATION

(71) Applicant: SAMSUNG ELECTRONICS CO., LTD., Suwon-si, Gyeonggi-Do (KR)

(72) Inventors: Jae-Eun Lee, Hwaseong-si (KR); Sunghoon Kim, Seongnam-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 0 days.

(21) Appl. No.: 15/335,482

(22) Filed: Oct. 27, 2016

(65) Prior Publication Data

US 2017/0047345 A1    Feb. 16, 2017

Related U.S. Application Data

(62) Division of application No. 14/723,296, filed on May 27, 2015, now Pat. No. 9,515,083.

(30) Foreign Application Priority Data

Sep. 19, 2014   (KR) .......................... 10-2014-0125227

(51) Int. Cl.
*G11C 16/08* (2006.01)
*H01L 27/11582* (2017.01)
(Continued)

(52) U.S. Cl.
CPC ...... *H01L 27/11582* (2013.01); *H01L 23/528* (2013.01); *H01L 23/5226* (2013.01);
(Continued)

(58) Field of Classification Search
CPC ........... H01L 27/11582; H01L 23/5226; H01L 27/11568; H01L 23/535; H01L 23/528;
(Continued)

(56) References Cited

U.S. PATENT DOCUMENTS 5,895,947 A *   4/1999   Lee .................. H01L 27/10894
                                            257/303
6,342,416 B1 *  1/2002   Kim .................. H01L 27/10852
                                            257/E21.657

(Continued)

FOREIGN PATENT DOCUMENTS

KR          10-0577603 B1      5/2006

*Primary Examiner* — Khamdan Alrobaie
(74) *Attorney, Agent, or Firm* — Volentine & Whitt, PLLC

(57) ABSTRACT

A nonvolatile memory device includes a memory cell array including a plurality of memory cells, a first metal layer, a peripheral circuit configured to control the memory cell array, a second metal layer, and a pad. The first metal layer is disposed on the memory cell array and includes a plurality of cell region interconnections connected to the memory cell array. The second metal layer is disposed on the peripheral circuit and includes a plurality of peripheral region interconnections connecting the peripheral circuit and the plurality of cell region interconnections. The pad is disposed on the second metal layer and exchanges data, an address, or a command with the peripheral circuit during operation of the device. The second metal layer is lower than the first metal layer relative to a substrate of the device.

8 Claims, 18 Drawing Sheets

(51) Int. Cl.
| | |
|---|---|
| *H01L 27/11573* | (2017.01) |
| *H01L 27/1157* | (2017.01) |
| *H01L 23/522* | (2006.01) |
| *H01L 23/528* | (2006.01) |
| *H01L 23/535* | (2006.01) |
| *H01L 27/11568* | (2017.01) |

(52) U.S. Cl.
CPC ........ *H01L 23/535* (2013.01); *H01L 27/1157* (2013.01); *H01L 27/11568* (2013.01); *H01L 27/11573* (2013.01); *G11C 16/08* (2013.01); *H01L 2224/04042* (2013.01); *H01L 2924/10252* (2013.01); *H01L 2924/10253* (2013.01); *H01L 2924/10329* (2013.01); *H01L 2924/10335* (2013.01); *H01L 2924/145* (2013.01); *H01L 2924/1434* (2013.01); *H01L 2924/1438* (2013.01); *H01L 2924/1443* (2013.01); *H01L 2924/1451* (2013.01); *H01L 2924/14511* (2013.01)

(58) Field of Classification Search
CPC ........... H01L 27/1157; H01L 27/11573; H01L 2924/1451; H01L 2924/10253; H01L 2924/10252; H01L 2924/1434; H01L 2924/1438; H01L 2924/1443; H01L 2924/10329; H01L 2224/04042; H01L 2924/145; H01L 2924/10335
See application file for complete search history.

(56) References Cited

U.S. PATENT DOCUMENTS

| | | | |
|---|---|---|---|
| 7,144,798 B2 * | 12/2006 | Jang | .................. H01L 21/76885 257/E21.589 |
| 7,443,714 B1 * | 10/2008 | Kim | ..................... G11C 11/4076 365/149 |
| 7,679,133 B2 | 3/2010 | Son et al. | |
| 8,258,493 B2 | 9/2012 | Mikawa et al. | |
| 8,546,780 B2 | 10/2013 | Iijima et al. | |
| 8,553,466 B2 | 10/2013 | Han et al. | |
| 8,559,235 B2 | 10/2013 | Yoon et al. | |
| 8,634,242 B2 | 1/2014 | Grossi et al. | |
| 8,654,587 B2 | 2/2014 | Yoon et al. | |
| 8,811,055 B2 | 8/2014 | Yoon | |
| 2002/0017672 A1 | 2/2002 | Ker et al. | |
| 2003/0064562 A1 | 4/2003 | Kim et al. | |
| 2009/0026621 A1 | 1/2009 | Poddar | |
| 2011/0193197 A1 | 8/2011 | Farooq et al. | |
| 2011/0215394 A1 | 9/2011 | Komori et al. | |
| 2011/0220987 A1 * | 9/2011 | Tanaka | ............. H01L 27/11575 257/324 |
| 2011/0233648 A1 | 9/2011 | Seol et al. | |
| 2014/0061750 A1 | 3/2014 | Kwon et al. | |
| 2014/0097519 A1 | 4/2014 | Cho et al. | |
| 2016/0056125 A1 * | 2/2016 | Pan | ..................... H01L 25/0655 257/676 |

\* cited by examiner

NONVOLATILE MEMORY DEVICE HAVING PAD STRUCTURE FOR HIGH SPEED OPERATION

PRIORITY STATEMENT

This is a Divisional of U.S. application Ser. No. 14/723,296, filed May 27, 2015, in which a claim for priority under 35 U.S.C. § 119 is made to Korean Patent Application No. 10-2014-0125227 filed Sep. 19, 2014, in the Korean Intellectual Property Office, the entire contents of both of which are hereby incorporated by reference.

BACKGROUND

The inventive concepts described herein relate to a semiconductor memory, and more particularly, relate to a nonvolatile memory device.

A semiconductor memory device is a storage device which is fabricated using semiconductors such as, but not limited to, silicon (Si), germanium (Ge), gallium arsenide (GaAs), and indium phosphide (InP). Semiconductor memory devices are classified into volatile memory devices and nonvolatile memory devices.

The volatile memory devices may lose contents stored therein at power-off. Volatile memory devices include the following: a static RAM (SRAM), a dynamic RAM (DRAM), and a synchronous DRAM (SDRAM). The nonvolatile memory devices may retain stored contents even at power-off. Nonvolatile memory devices include the following: a read only memory (ROM), a programmable ROM (PROM), an electrically programmable ROM (EPROM), an electrically erasable and programmable ROM (EEPROM), a flash memory device, a phase-change RAM (PRAM), a magnetic RAM (MRAM), a resistive RAM (RRAM), and a ferroelectric RAM (FRAM). The flash memory is classified as a NOR type or a NAND type.

A three-dimensional semiconductor memory device of a three-dimensional array structure is being researched to improve the degree of integration of a semiconductor memory. The height of the three-dimensional semiconductor memory device continues to increase. When a distance between a peripheral circuit and a pad increases, resistance and capacitance also increase, thereby making response speed of the three-dimensional semiconductor memory device slow.

SUMMARY

According to one aspect of the inventive concept there is provided a nonvolatile memory device comprising a memory cell array including a plurality of memory cells, a first metal layer on the memory cell array and including a plurality of cell region interconnections connected to the memory cell array, a peripheral circuit configured to control the memory cell array, a second metal layer on the peripheral circuit and including a plurality of peripheral region interconnections connecting the peripheral circuit and the plurality of cell region interconnections, and a pad on the second metal layer and dedicated for use in exchanging data, an address, or a command with the peripheral circuit, and in which the second metal layer is disposed at a level in the device that is lower than that at which the first metal layer is disposed in the device.

According to another aspect of the inventive concept, there is provided a nonvolatile memory device comprising a memory cell array including a plurality of memory cells, a first metal layer including a plurality of cell region interconnections connected to the memory cell array, a peripheral circuit configured to control the memory cell array, a second metal layer on the peripheral circuit and including a peripheral region interconnection connecting the peripheral circuit and the plurality of cell region interconnections, and a pad on the first metal layer and dedicated for use in exchanging data, an address, or a command with the peripheral circuit, and in which the first metal layer includes a cell array region and a pad region, the cell array region is disposed on the memory cell array, the pad is disposed on the pad region of the first metal layer, and the pad region of the first metal layer occupies a level in the device different from that occupied by the cell array region of the first metal layer.

According to still another aspect of the inventive concept, there is provided a nonvolatile memory chip comprising a chip body having a major surface, and a pad opening extending therein from the major surface, a memory cell array including a plurality of memory cells embedded in the chip body, a first metallization layer including a plurality of cell region interconnections disposed on the memory cell array as embedded in the chip body, cell contacts extending vertically in the chip body and electrically connecting the cell region interconnections to the memory cell array, a peripheral circuit embedded in the chip body and configured to control the memory cell array, a second metallization layer embedded in the chip body and extending over the peripheral circuit, peripheral contacts extending vertically in the chip body between and electrically connecting the peripheral circuit to the second metallization layer, and an inter-metal contact extending vertically in the chip body between and electrically connecting the first and second metallization layers to one another, and in which the peripheral circuit and the memory cell array are electrically connected to one another through the second metallization layer and the inter-metal contact, the pad opening extends from the major surface of the chip body towards a portion of the second metallization layer and exposes a pad at that portion of the second metallization layer, and the first and second metallization layers occupy different levels in the chip body with respect to one another.

BRIEF DESCRIPTION OF THE DRAWINGS

The above and other objects and features will become MORE apparent from the following description with reference to the following figures, wherein like reference numerals designate like parts throughout the various figures unless otherwise specified, and wherein.

DETAILED DESCRIPTION OF THE PREFERRED EMBODIMENTS

Figure 1:
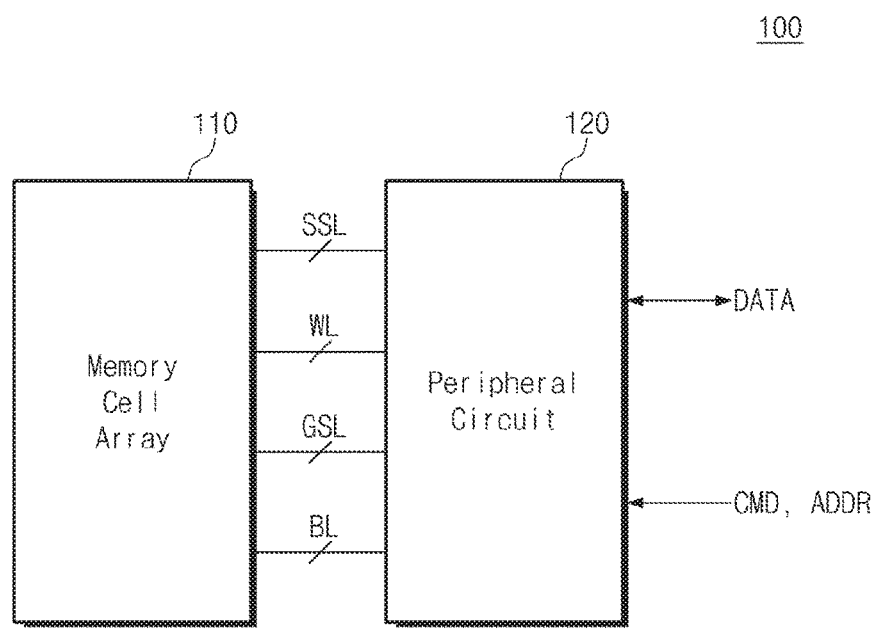
FIG. 1 is a block diagram of a nonvolatile memory device according to the inventive concept.

Embodiments will be described in detail with reference to the accompanying drawings. The inventive concept, however, may be embodied in various different forms, and should not be construed as being limited only to the illustrated embodiments. Rather, these embodiments are provided as examples so that this disclosure will be thorough and complete, and will fully convey the concept of the inventive concept to those skilled in the art. Accordingly, known processes, elements, and techniques are not described with respect to some of the embodiments of the inventive concept. Unless otherwise noted, like reference numerals denote like elements throughout the attached drawings and written description, and thus descriptions will not be repeated. In the drawings, the sizes and relative sizes of layers and regions may be exaggerated for clarity.

In an embodiment of the present inventive concept, a three dimensional (3D) memory array is provided. The 3D memory array is monolithically formed in one or more physical levels of arrays of memory cells having an active area disposed above a silicon substrate and circuitry associated with the operation of those memory cells, whether such associated circuitry is above or within such substrate. The term "monolithic" means that layers of each level of the array are directly deposited on the layers of each underlying level of the array.

In an embodiment of the present inventive concept, the 3D memory array includes vertical NAND strings that are vertically oriented such that at least one memory cell is located over another memory cell. The at least one memory cell may comprise a charge trap layer. Each vertical NAND string may include at least one select transistor located over memory cells, the at least one select transistor having the same structure with the memory cells and being formed monolithically together with the memory cells.

The following patent documents, which are hereby incorporated by reference, describe suitable configurations for three-dimensional memory arrays, in which the three-dimensional memory array is configured as a plurality of levels, with word lines and/or bit lines shared between levels: U.S. Pat. Nos. 7,679,133; 8,553,466; 8,654,587; 8,559,235; and US Pat. Pub. No. 2011/0233648.

It will be understood that, although the terms "first", "second", "third", etc., may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the inventive concept.

Spatially relative terms, such as "beneath", "below", "lower", "under", "above", "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" or "under" other elements or features would then be oriented "above" the other elements or features. Thus, the exemplary terms "below" and "under" can encompass both an orientation of above and below. The device may be otherwise oriented (rotated 90 degrees or at other orientations) and the spatially relative descriptors used herein interpreted accordingly. In addition, it will also be understood that when a layer is referred to as being "between" two layers, it can be the only layer between the two layers, or one or more intervening layers may also be present.

The terminology used herein is for the purpose of describing particular embodiments only and is not intended to be limiting of the inventive concept. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items. Also, the term "exemplary" is intended to refer to an example or illustration.

It will be understood that when an element or layer is referred to as being "on", "connected to", "coupled to", or "adjacent to" another element or layer, it can be directly on, connected, coupled, or adjacent to the other element or layer, or intervening elements or layers may be present. In contrast, when an element is referred to as being "directly on," "directly connected to", "directly coupled to", or "immediately adjacent to" another element or layer, there are no intervening elements or layers present. The term "connected to" will be generally used to refer to electrical connections as the context makes clear.

Unless otherwise defined, all terms (including technical and scientific terms) used herein have the same meaning as commonly understood by one of ordinary skill in the art to which this inventive concept belongs. For example, the term "metal layer" or "metallization layer" will be understood as referring to a patterned layer of electrically conductive material. The term "level" is understood by those in the art as referring to the space between two horizontal planes corresponding to a thickness of conductive or insulating layers formed in the process of fabricating a semiconductor device. It will be further understood that terms, such as those defined in commonly used dictionaries, should be interpreted as having a meaning that is consistent with their meaning in the context of the relevant art and/or the present specification and will not be interpreted in an idealized or overly formal sense unless expressly so defined herein.

FIG. 1 schematically illustrates embodiments of a nonvolatile memory device according to the inventive concept. Referring to FIG. 1, a nonvolatile memory device 100 contains a memory cell array 110 and a peripheral circuit 120.

The memory cell array 110 and the peripheral circuit 120 are connected through string selection lines SSL, word lines WL, a ground selection line or ground selection lines GSL, and bit lines BL. The memory cell array 110 may contain a plurality of memory blocks. Memory cells of each memory block may be arrayed in a planar configuration, i.e., may form a two-dimensional structure. Alternatively, memory cells of each memory block may be stacked in a direction perpendicular to a substrate to form a three-dimensional structure. Each memory block may include a plurality of memory cells and a plurality of selection transistors.

The peripheral circuit 120 receives a command CMD and an address ADDR from an external device. The peripheral circuit 120 stores data from the external device in the memory cell array 110 based on the command CMD and the address ADDR. The peripheral circuit 120 outputs data, i.e., reads data, from the memory cell array 110 to the external device, based on the command CMD and the address ADDR.

Although not shown in FIG. 1, a command CMD, an address ADDR, and data are exchanged between the nonvolatile memory device 100 and the external device through pads. The pads are exposed or accessed through pad openings. Shortening the path between the pad and the peripheral circuit 120 allows the peripheral circuit 120 to operate at a higher speed.

Figure 2:
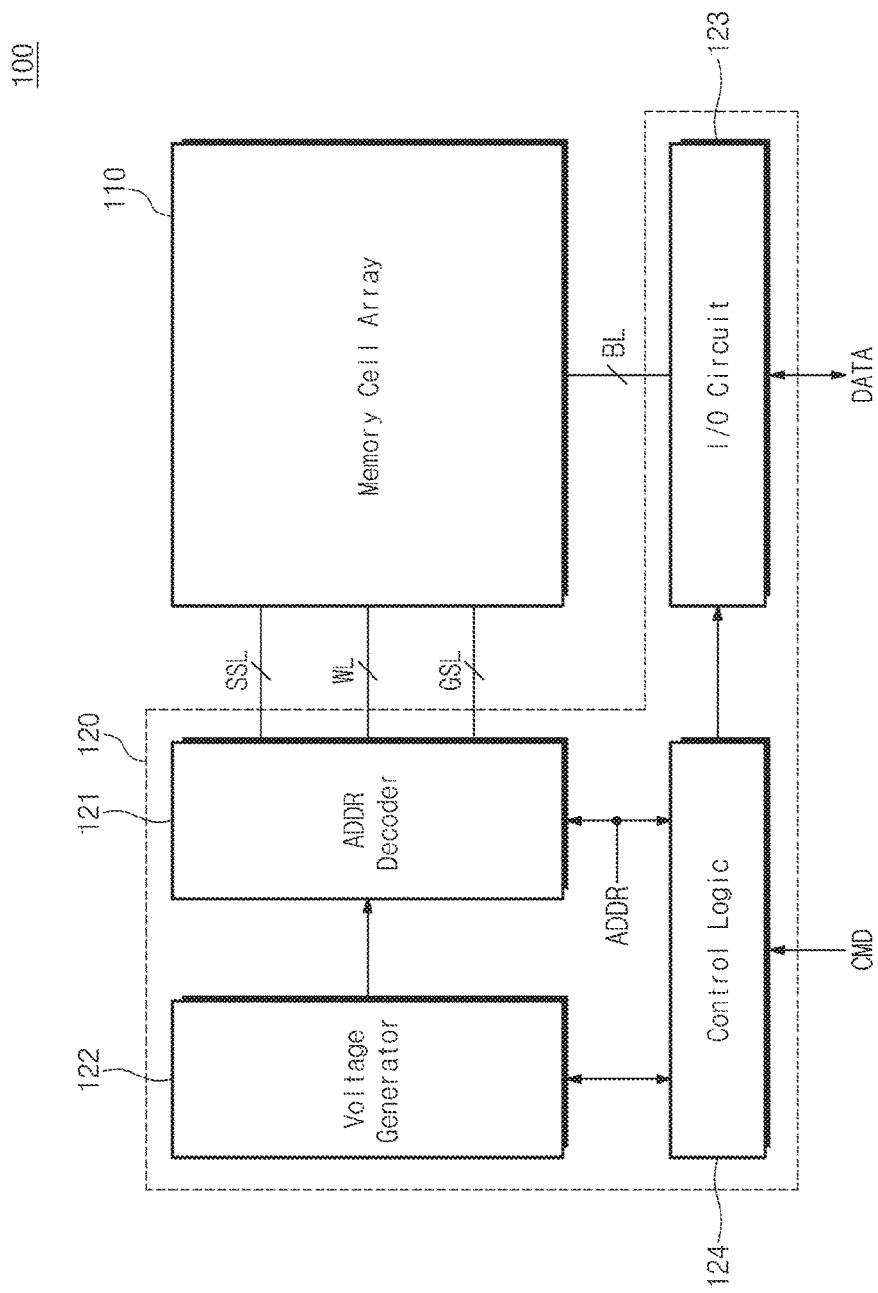
FIG. 2 is a block diagram illustrating the nonvolatile memory device shown in FIG. 1 in more detail.

FIG. 2 schematically illustrates a more detailed example of the nonvolatile memory device shown in FIG. 1. Referring to FIG. 2, the peripheral circuit 120 includes an address decoder 121, a voltage generator 122, an input/output circuit 123, and control logic 124.

The memory cell array 110 is connected to the address decoder 121 through string selection lines SSL, word lines WL, and ground selection lines GSL and to the input/output circuit 123 through bit lines BL. The memory cells of memory cell array 110 may be connected to the word lines, and the selection transistors of memory cell array 110 may be connected to the string selection lines SSL or the ground selection lines GSL. Memory cells of each memory block may store one or more bits.

The address decoder 121 is connected to the memory cell array 110 through the word lines WL, the string selection lines SSL, and the ground selection lines GSL. The address decoder 120 operates in response to a control of the control logic 124. The address decoder 121 receives an address ADDR from an external device.

The address decoder 121 decodes a row address of the received address ADDR. The address decoder 121 selects the word lines, the string selection lines SSL, and the ground selection lines GSL using the decoded row address. The address decoder 121 receives various voltages from the voltage generator 122 and transfers the received voltages to the selected and unselected string selection lines SSL, the word lines WL, and the ground selection lines GSL.

The address decoder 120 decodes a column address of an input address. The decoded column address may be transferred to the input/output circuit 123. In exemplary embodiments, the address decoder 121 may include a row decoder, a column decoder, and an address buffer.

The voltage generator 122 generates various voltages needed for the nonvolatile memory device 100. For example, the voltage generator 122 generates a plurality of program voltages, a plurality of pass voltages, a plurality of selection read voltages, and a plurality of non-selection read voltages.

The input/output circuit 123 is connected to the memory cell array 110 through the bit lines BL. The input/output circuit 123 exchanges data with the external device. The input/output circuit 123 operates in response to a control of the control logic 124. The input/output circuit 123 receives the decoded column address from the address decoder 121. The input/output circuit 123 selects the bit lines depending on the decoded column address.

The input/output circuit 123 receives data from the external device and writes the received data at the memory cell array 110. The input/output circuit 123 reads data from the memory cell array 110 and outputs the read data to the external device. The input/output circuit 123 reads data from a first area of the memory cell array 110 and then stores the read data at a second area of the memory cell array 110. For example, the input/output circuit 123 is configured to perform a copy-back operation.

In exemplary embodiments, the input/output circuit 123 includes a page buffer (or, a page register), a column selecting circuit, and a data buffer. In other exemplary embodiments, the input/output circuit 123 includes a sense amplifier, a write driver, a column selecting circuit, and a data buffer.

The control logic 124 is connected with the address decoder 121, the voltage generator 122, and the input/output circuit 123. The control logic 124 controls an overall operation of the nonvolatile memory device 100. The control logic 123 operates in response to control signals or commands that the external device provides.

Figure 3:
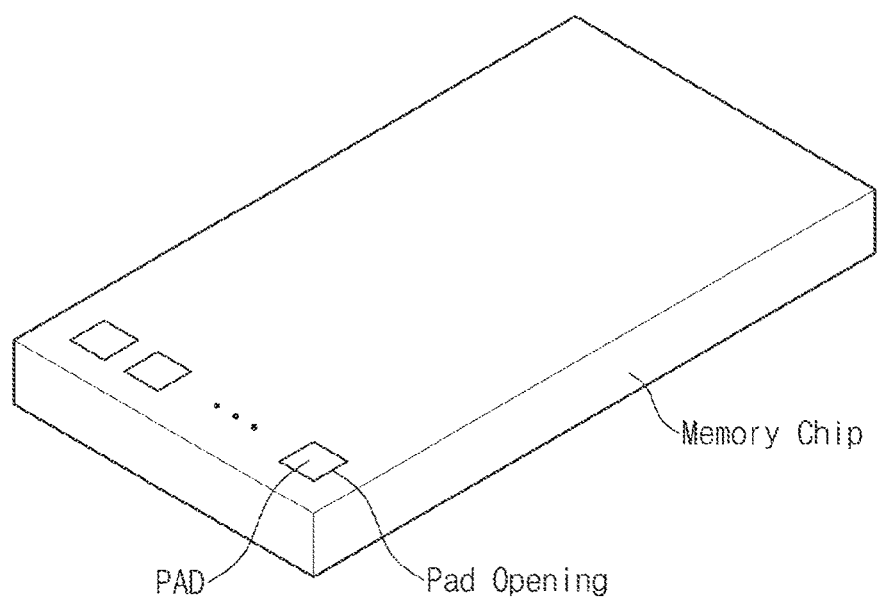
FIG. 3 is a perspective view of a nonvolatile memory device of FIG. 2 in chip form.

FIG. 3 is a perspective view of a memory chip including a nonvolatile memory device shown in FIG. 2. Referring to FIGS. 2 and 3, the memory chip contains a plurality of pads. The pads are exposed through pad openings. The memory chip may be connected with an external device through the pads. A command CMD, an address ADDR, and data that are received from the external device may be transmitted to a peripheral circuit 120 through the pads. The pads may be connected to a package using, for example, a bonding wire technique.

Figure 4:
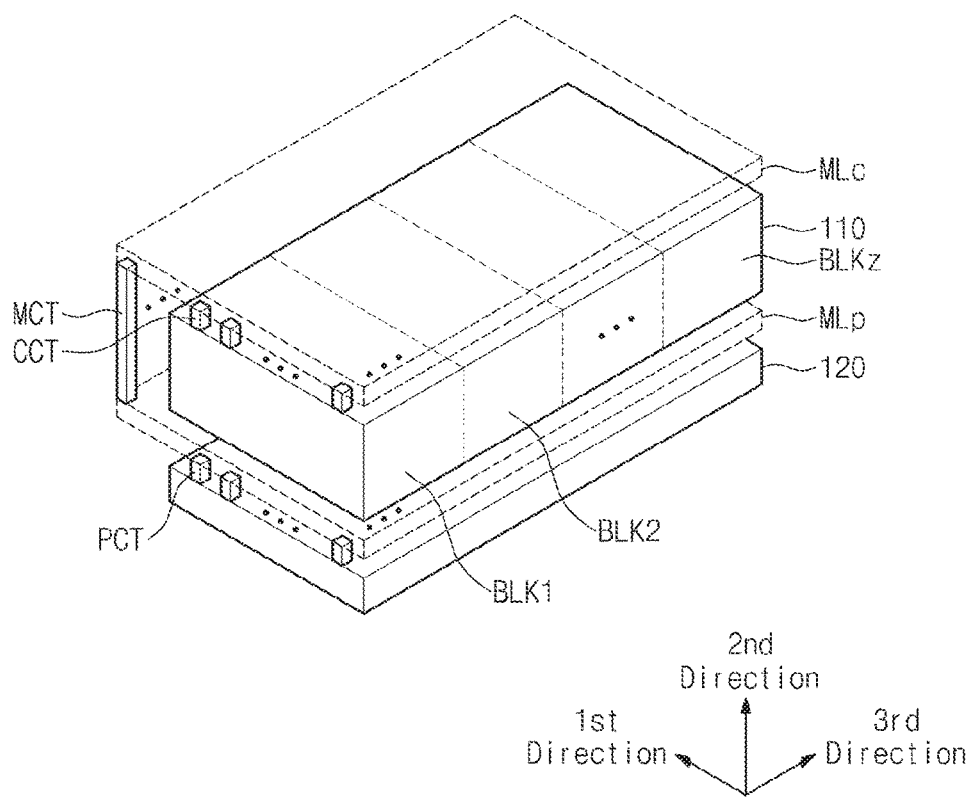
FIG. 4 is a perspective view of a memory cell array and a peripheral circuit of the nonvolatile memory device (chip) shown in FIG. 3.

FIG. 4 is a perspective view of the memory chip in more detail showing the memory cell array 110 and peripheral circuit 120.

Referring to FIG. 4, memory cell array 110 and a peripheral circuit 120 are connected through cell region metal layer MLc and peripheral region MLp. The materials of the cell region and peripheral region metal layers MLc and MLp may be different from each other. A cell region metal layer MLc is disposed on the memory cell array 110. The cell region metal layer MLc may include a plurality of cell interconnections. A peripheral region metal layer MLp is disposed on the peripheral circuit 120. The metal layer MLp is thus disposed under the metal layer MLc. The peripheral region metal layer MLp may include a plurality of peripheral interconnections. The memory cell array 110 is connected to (the interconnections of) the cell region metal layer MLc through cell contacts CCT. The peripheral circuit 120 is connected to (the interconnections of) the peripheral region metal layer MLp through peripheral contacts PCT. The cell region metal layer MLc and the peripheral region metal layer MLp are connected through inter-metal contacts MCT.

In FIG. 4, the cell contacts CCT, peripheral contacts PCT, and inter-metal contacts MCT are partially illustrated. However, other cell contacts CCT may be provided at any portion of an upper surface of the memory cell array 110. Other peripheral contacts PCT may be provided at any portion of an upper surface of the peripheral circuit 120. Other inter-metal contacts MCT may be provided at any portion between the cell region metal layer MLc and the peripheral region metal layer MLp.

The memory cell array 110 has a three-dimensional (or vertical) structure. For example, memory blocks BLK1 through BLKz may each include layers of memory cells stacked in a second direction extending perpendicular to a plane extending in first and third orthogonal directions. The peripheral circuit 120 may have a planar form and is substantially disposed in a plane that extends in the first and third directions.

In the embodiment shown in FIG. 4, the peripheral circuit 120 is disposed below the memory cell array 110. This type of is arrangement is referred to as a "Cell Over Peri (COP)" structure. In a conventional COP structure, a pad and the peripheral circuit may be relatively far apart from each other. In this case, resistance and capacitance between the pad and the peripheral circuit are relatively high.

The peripheral circuit 120 may include a plurality of transistors for performing various functions. Each transistor may include a gate electrode and source and drain regions that are disposed symmetrically with respect to the gate electrode. The source region may be connected to the peripheral region metal layer MLp through the peripheral contacts PCT. The drain region may be connected to the peripheral region metal layer MLp through the peripheral contacts PCT.

Figure 5:
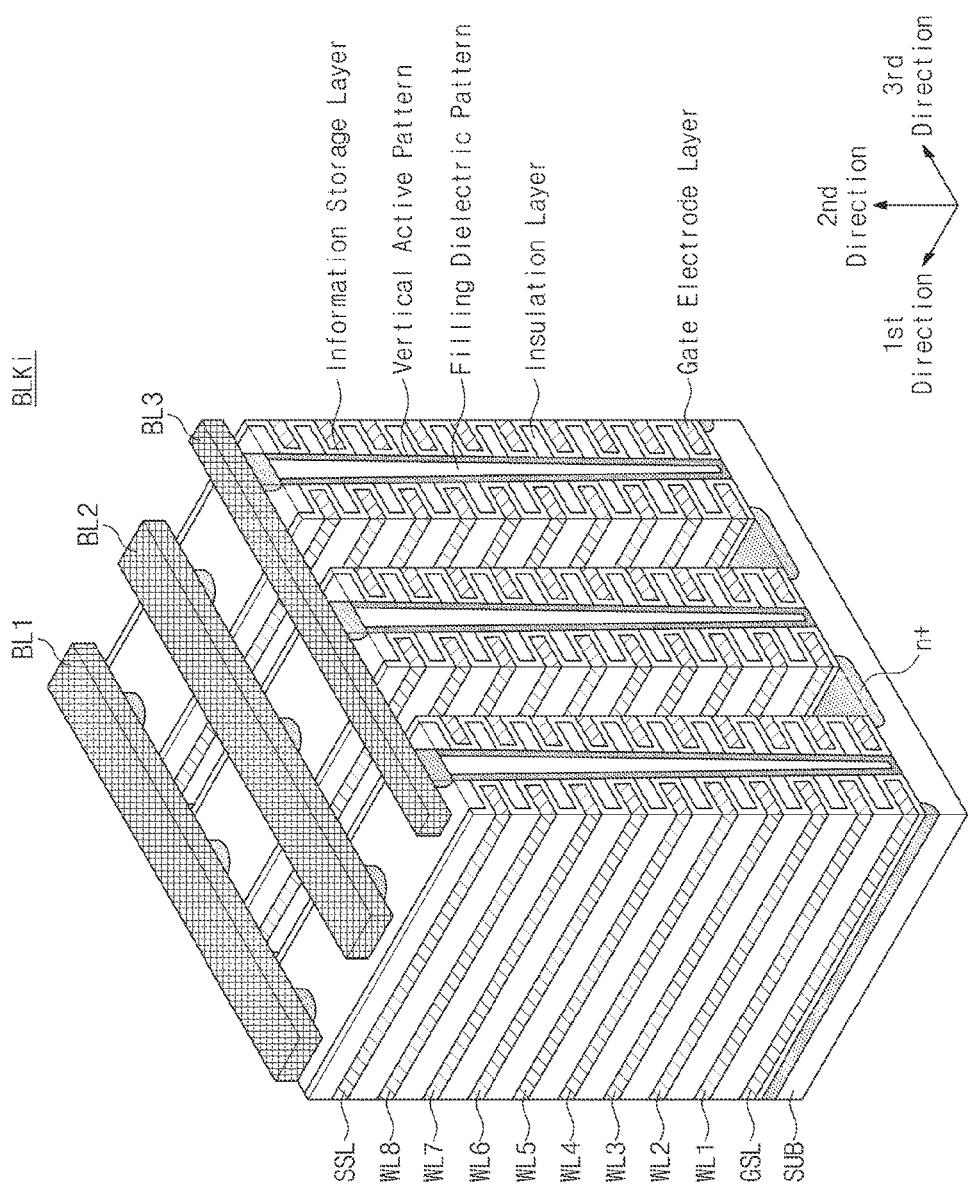
FIG. 5 is a perspective view of a memory block of the memory cell array shown in FIG. 4.

FIG. 5 is a perspective view of one of the memory blocks shown in FIG. 4. The memory block BLKi may be formed on a semiconductor layer. For example, referring to FIG. 5, a memory block BLKi is formed on a semiconductor substrate SUB. The substrate SUB may be a p-type semiconductor substrate. However, the inventive concept is not limited to memory devices having p-type semiconductor substrates; rather, such a substrate SUB will be described as an example only. An n+ doping region extends longitudinally in the substrate SUB in a first direction. Alternatively, the semiconductor layer, i.e., the p-type SUB in this example, may be a pocket well in a bulk substrate.

Gate electrode and insulation layers are sequentially deposited above the substrate SUB. An information storage layer is formed between the gate electrode layers and the insulation layers.

V-shaped pillars extend in a vertical direction through the stack of gate electrode and insulation layers. The pillars are in contact with the active portion of the substrate SUB via the gate electrode layers and the insulation layers. An outer portion of each pillar may be an active pattern forming a vertical channel, and an inner portion of each pillar may be may be a filling dielectric pattern formed of an insulation material such as silicon oxide.

The gate electrode layers of the memory block BLKi may be connected with a ground selection line GSL, a plurality of word lines WL1 to WL8, and a string selection line SSL. The pillars of the memory block BLKi are connected with a plurality of bit lines BL1 to BL3. In FIG. 5, one memory block BLKi is illustrated as having two selection lines SSL and GSL, eight word lines WL1 to WL8, and three bit lines BL1 to BL3. However, the inventive concept is not limited thereto.

Figure 6:
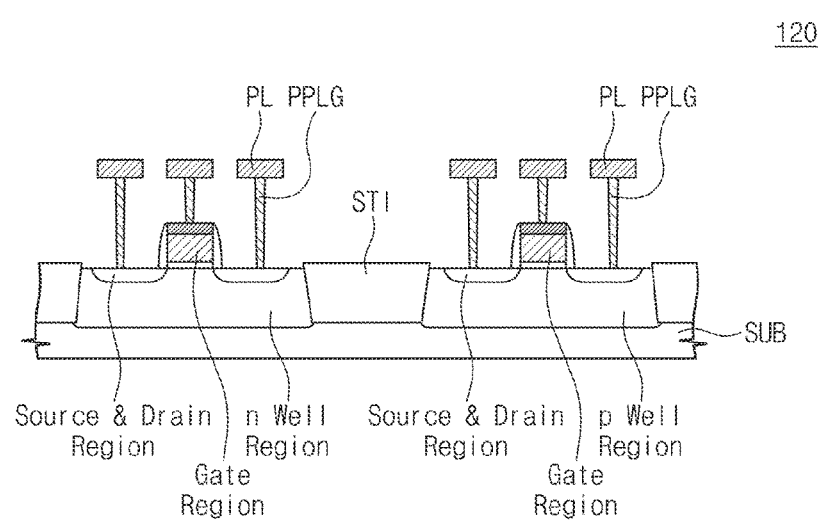
FIG. 6 is a sectional view of the peripheral circuit shown in FIG. 4.

FIG. 6 shows the peripheral circuit 120 of the device. Referring to FIG. 6, the peripheral circuit 120 contains a plurality of transistors. Each transistor has source, drain and gate regions.

In this embodiment, the peripheral circuit 120 has a substrate SUB including an n-well region (region of a substrate doped with n-type impurities) and a p-well region (region of the substrate doped with p-type impurities). Active regions comprising the n-well and p-well regions are defined by a device isolation film STI.

For example, the peripheral circuit 120 includes PMOS transistors at the n-well region, and NMOS transistors at the p-well region. Gate regions (gate structures including gate electrodes) are disposed on the n-well and p-well regions. Source and drain regions are disposed at both sides of each gate region. The NMOS and PMOS transistors are connected with peripheral circuit plugs PPLG and peripheral circuit interconnections PL. The peripheral circuit interconnections PL are connected with a peripheral region metal layer MLp through a peripheral contact PCT (refer to FIG. 4).

Figure 7:
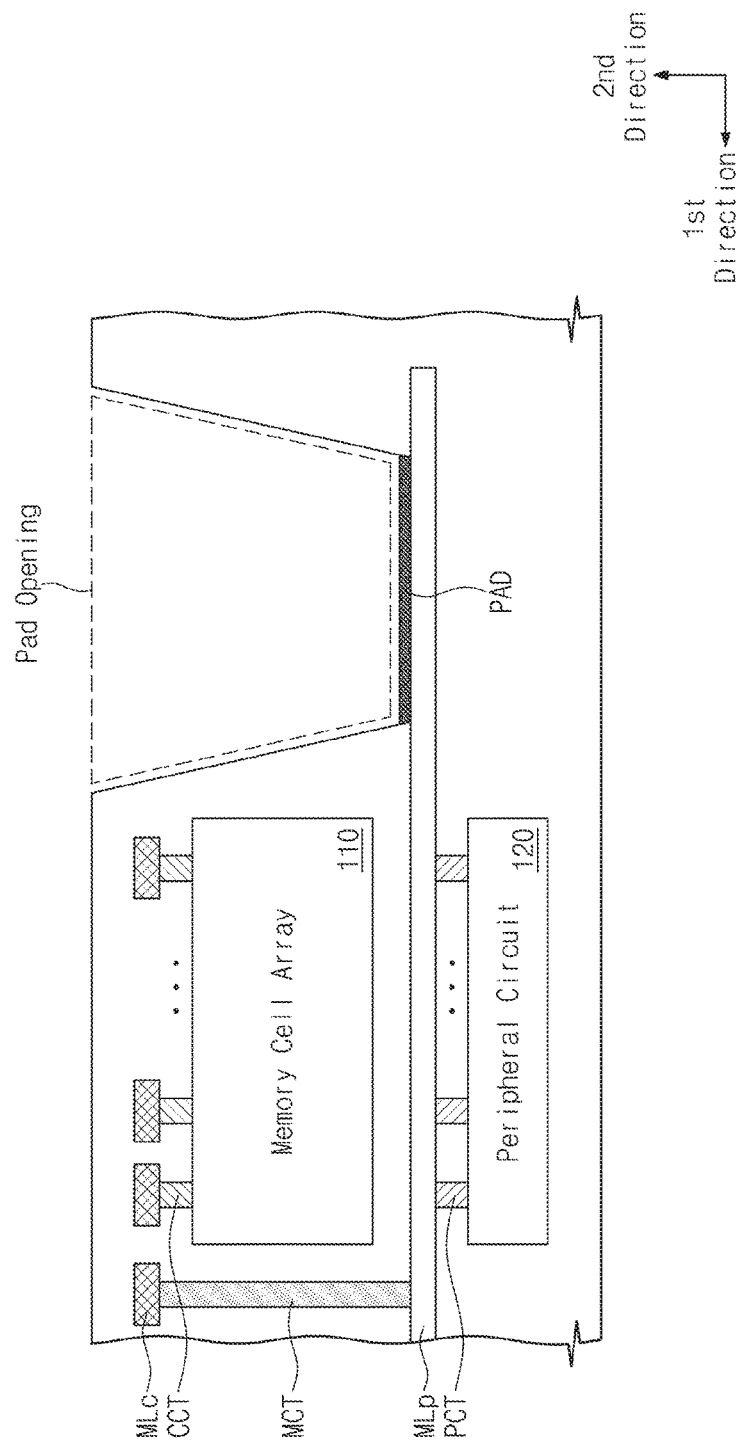
FIG. 7 is a cross-sectional view of a portion of the chip (nonvolatile memory device) of FIG. 2 having one example of a pad opening according to the inventive concept.

FIG. 7 shows one example of a pad opening according to the inventive concept. Referring to FIG. 7, the pad opening extends from an upper surface of the nonvolatile memory device or chip (refer to FIG. 2) to the peripheral region metal layer MLp. A pad may be disposed on the peripheral region metal layer MLp at the location of the pad opening so as to be exposed by the pad opening. The nonvolatile memory device may be connected with a package through the pad. For example, the pad may be connected by a bonding wire to an input/output terminal of the package. The pad may have a standard size. For example, a width of the pad may be about 65 μm. The pad opening may be formed to a depth at least equal to the height of a memory cell array 110. The depth of the pad opening may be about 3 μm. Thus, the pad may be formed by a process conventional per se.

The peripheral circuit interconnections PL may connect transistors of the peripheral circuit 120 to form the address decoder 121, voltage generator 122, input/output circuit 123, and control logic 124. A cell region metal layer MLc is formed on the memory cell array 110. The cell interconnections of cell region metal layer MLc may be connected with selection lines SSL and GSL, word lines WL, and bit lines BL of the memory cell array 110. The peripheral region metal layer MLp and the cell region metal layer MLc may be disposed at different levels in the nonvolatile memory device 100 (chip). For example, the peripheral region metal layer MLp may be disposed at a level lower than that of the cell region metal layer MLc.

In this embodiment of a nonvolatile memory device 100 according to the inventive concept, the pad opening extends to the peripheral region metal layer MLp. Thus, the path between the pad and the peripheral circuit 120 may be relatively short. Accordingly, resistance and capacitance between the pad and the peripheral circuit 120 are relatively low. Thus, the peripheral circuit 120 may operate in high speed.

Figure 8:
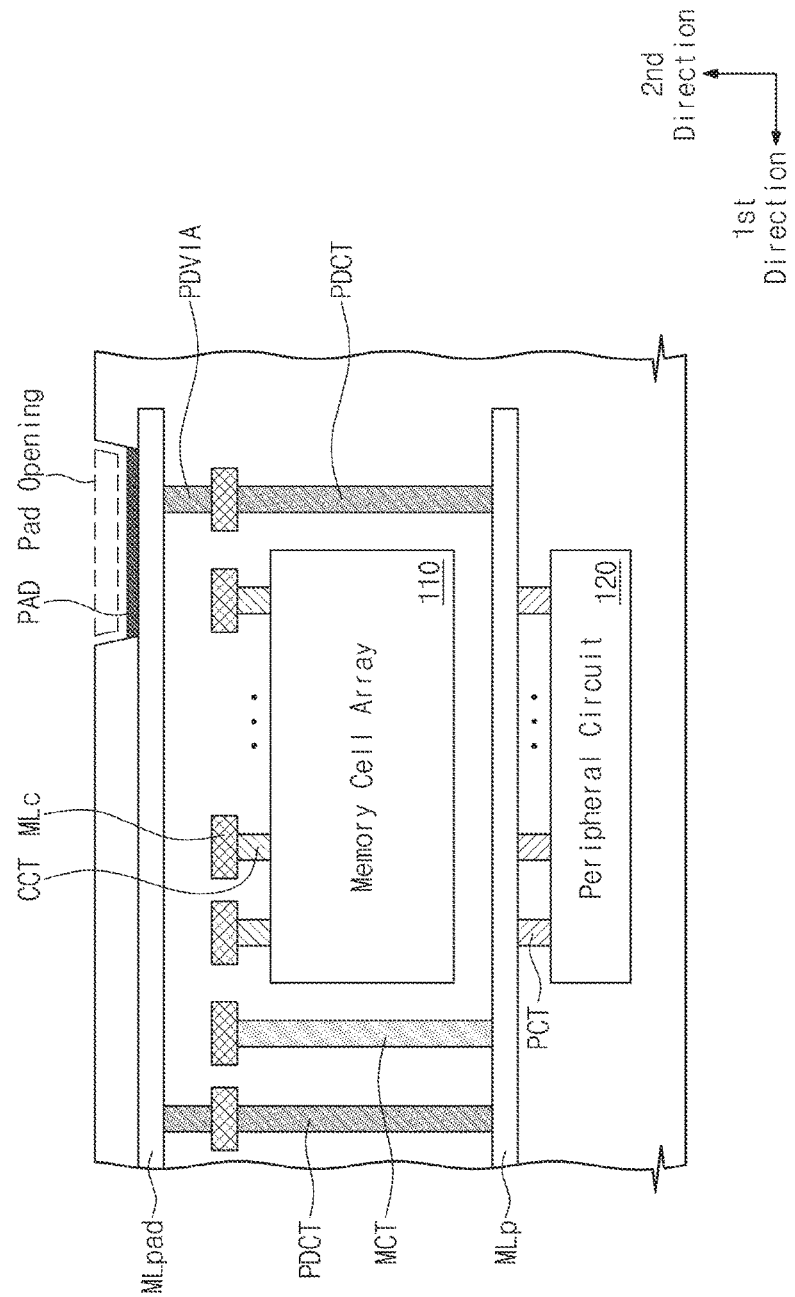
FIG. 8 is a cross-sectional view of a portion of the chip of FIG. 2 having another example of a pad opening according to the inventive concept.

FIG. 8 illustrates another example of a pad opening according to the inventive concept. Referring to FIG. 8, the pad opening extends to a pad metal layer MLpad. A cell region metal layer MLc and a peripheral region metal layer MLp are substantially the same as those shown in FIG. 7, and thus will not be described in detail.

The pad metal layer MLpad is connected with the peripheral region metal layer MLp through a plurality of interconnections. For example, the pad metal layer MLpad is connected with the cell region metal layer MLc through a plurality of vias PDVIA. The cell region metal layer MLc is connected with the peripheral region metal layer MLp through a plurality of pad contacts PDCT. Thus, resistance and capacitance between the pad and peripheral circuit 120 may be reduced.

Figure 9:
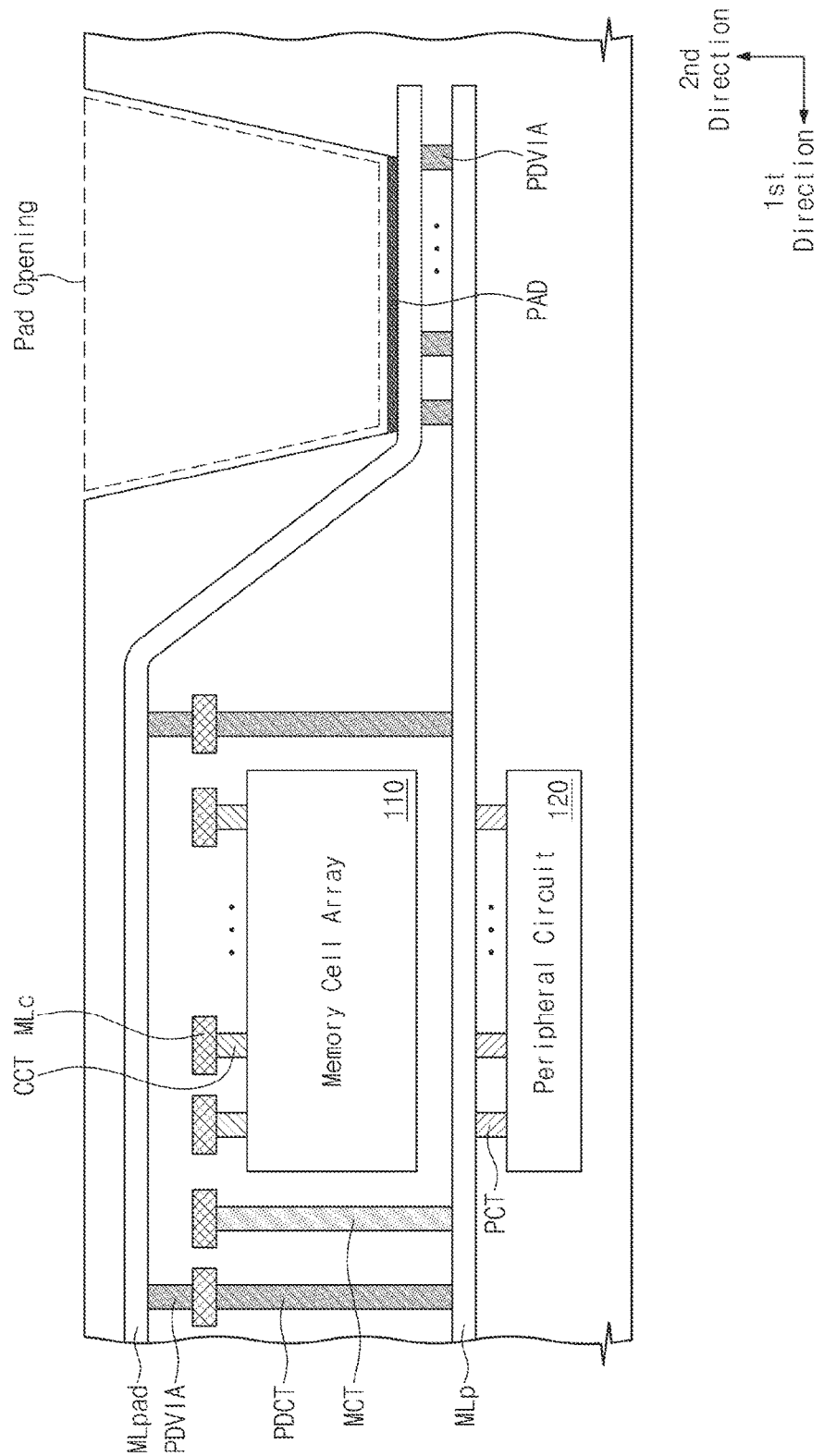
FIG. 9 is a cross-sectional view of a portion of the chip of FIG. 2 having still another example of a pad opening according to the inventive concept.

FIG. 9 illustrates still another example of a pad opening according to the inventive concept. Referring to FIG. 9, the pad opening extends to a pad metal layer MLpad. A cell region metal layer MLc and a peripheral region metal layer MLp are substantially the same as those shown in FIG. 7, and thus will not be described in detail.

The pad metal layer MLpad is connected with the peripheral region metal layer MLp through a plurality of interconnections. For example, the pad metal layer MLpad is connected with the cell region metal layer MLc through a plurality of vias PDVIA. The cell region metal layer MLc is connected with the peripheral region metal layer MLp through a plurality of pad contacts PDCT.

The height of the pad metal layer MLpad varies relative to the substrate. For example, the part of the pad metal layer MLpad under the pad is lower than that part of the pad metal layer MLpad on memory cell array 110. The part of the pad metal layer MLpad under the pad is connected with the peripheral region metal layer MLp through pad vias PDVIA. Thus, a distance between the pad and peripheral circuit 120 may be relatively small. Accordingly, resistance and capacitance between the pad and a peripheral circuit 120 are correspondingly small.

Figure 10:
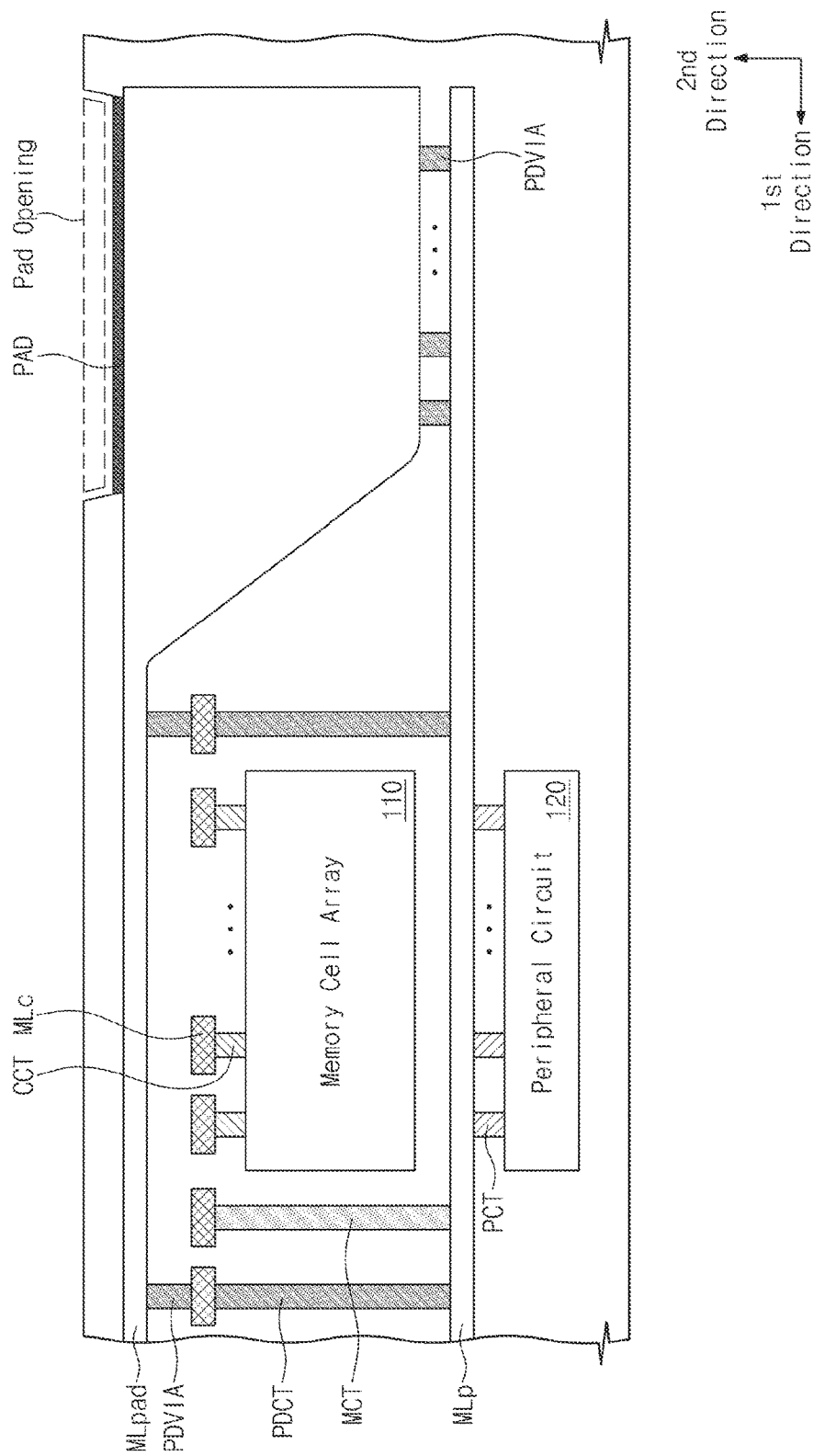
FIG. 10 is a cross-sectional view of a portion of the chip of FIG. 2 having still another example of a pad opening according to the inventive concept.

FIG. 10 illustrates still another example of a pad opening according to the inventive concept. Referring to FIG. 10, the pad opening extends to a pad metal layer MLpad. A cell region metal layer MLc and a peripheral region metal layer MLp are substantially the same as those shown in FIG. 7, and thus will not be described in detail.

The pad metal layer MLpad is connected with the peripheral region metal layer MLp through a plurality of interconnections. For example, the pad metal layer MLpad is connected with the cell region metal layer MLc through a plurality of vias PDVIA. The cell region metal layer MLc is connected with the peripheral region metal layer MLp through a plurality of pad contacts PDCT.

The thickness of the pad metal layer MLpad varies. For example, that part of the pad metal layer MLpad under the pad is thicker than that part of the pad metal layer MLpad on memory cell array 110. The pad metal layer MLpad under the pad is connected with the peripheral region metal layer MLp through pad vias PDVIA. Thus, resistance and capacitance between the pad and a peripheral circuit 120 are minimal.

Figure 11:
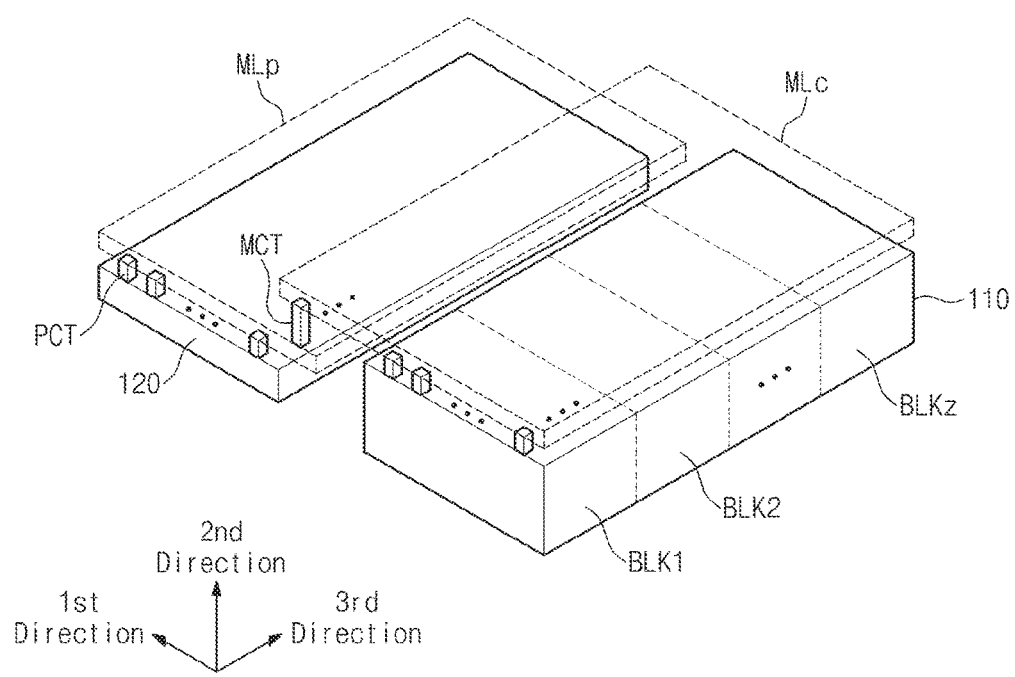
FIG. 11 is a perspective view of a memory cell array and a peripheral circuit of another embodiment of a chip (non-volatile memory device) according to inventive concept.

FIG. 11 illustrates a memory cell array and a peripheral circuit of another embodiment of a nonvolatile memory device according to the inventive concept. Referring to FIG. 11, a memory cell array 110 and a peripheral circuit 120 are connected through metal layers MLc and MLp. A cell region metal layer MLc is disposed on the memory cell array 110. The cell region metal layer MLc may include a plurality of cell interconnections. A peripheral region metal layer MLp is disposed on the peripheral circuit 120. The peripheral region metal layer MLp may include a plurality of peripheral interconnections. The memory cell array 110 is connected to the cell region metal layer MLc through cell contacts CCT. The peripheral circuit 120 is connected to the peripheral region metal layer MLp through peripheral contacts PCT. The cell region metal layer MLc and the peripheral region metal layer MLp are connected through inter-metal contacts MCT.

In FIG. 11, the cell contacts CCT, peripheral contacts PCT, and inter-metal contacts MCT are partially illustrated. However, other cell contacts CCT may be provided at any portion of an upper surface of the memory cell array 110. Other peripheral contacts PCT may be provided at any portion of an upper surface of the peripheral circuit 120. Other inter-metal contacts MCT may be provided at any portion between the cell region metal layer MLc and the peripheral region metal layer MLp.

The memory cell array 110 has a three-dimensional (or vertical) structure like that of the embodiment of FIGS. 3 and 4. The peripheral circuit 120 may include a plurality of transistors for performing various functions like that of the embodiment of FIGS. 3 and 4. Also, like the embodiment of FIGS. 3 and 4, the source and drain regions of the transistors may be connected to the peripheral region metal layer MLp through the peripheral contacts PCT.

Figure 12:
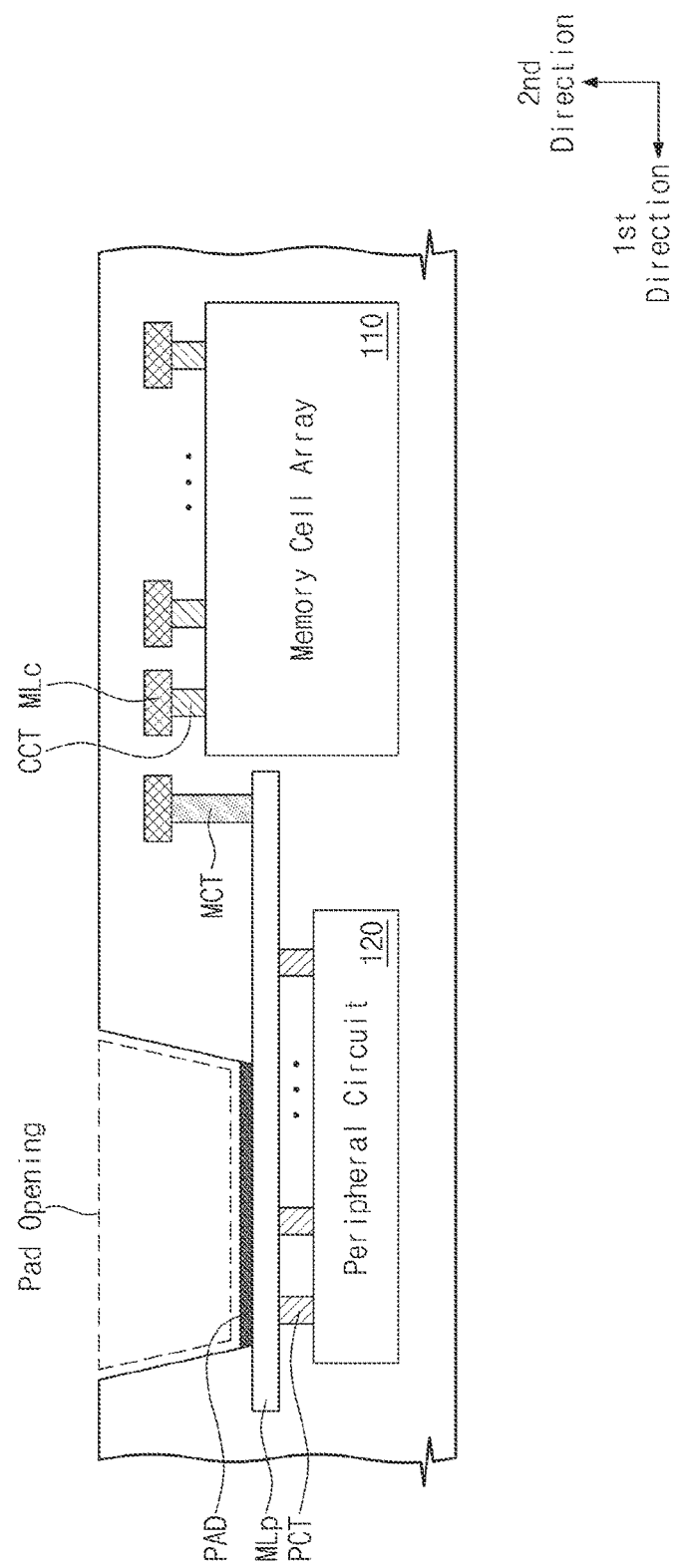
FIG. 12 is a cross-sectional view of a portion of the chip of FIG. 11 having an example of a pad opening according to the inventive concept.

FIG. 12 illustrates an example of a pad opening of the embodiment of FIG. 11, according to the inventive concept. Referring to FIG. 12, the pad opening extends to peripheral region metal layer MLp. A pad may be formed on the peripheral region metal layer MLp at the location of the pad opening so as to be exposed by the pad opening. The nonvolatile memory device may be connected with a package through the pad. For example, the pad may be connected by a bonding wire to an input/output terminal of the package.

Also, the peripheral circuit 120, like that of the nonvolatile memory device of FIG. 2, may include an address decoder 121, a voltage generator 122, an input/output circuit 123, and control logic 124. The peripheral circuit 120 may include transistors as shown in FIG. 6. A peripheral region metal layer MLp is disposed on the peripheral circuit 120. The peripheral region metal layer MLp may include a plurality of peripheral interconnections. The peripheral interconnections may connect transistors of the peripheral circuit 120 to form the address decoder 121, voltage generator 122, input/output circuit 123, and control logic 124.

A cell region metal layer MLc is disposed on the memory cell array 110. The cell region metal layer MLc may include a plurality of cell interconnections. The cell interconnections may be connected with selection lines SSL and GSL, word lines WL, and bit lines BL of the memory cell array 110. The cell region metal layer MLc is connected with the peripheral region metal layer MLp through an inter-metal contact MCT. The peripheral region metal layer MLp and the cell region metal layer MLc may be disposed at different heights relative to the substrate of the device. For example, the peripheral region metal layer MLp may be disposed at a level lower than that of the cell region metal layer MLc in the device.

In the example of this embodiment of a nonvolatile memory device according to the inventive concept, the pad opening extends to the peripheral region metal layer MLp. Thus, a path between the pad and the peripheral circuit 120 is relatively short. Therefore, resistance and capacitance between the pad and the peripheral circuit 120 are correspondingly low. Thus, the peripheral circuit 120 may operate at a high speed.

Figure 13:
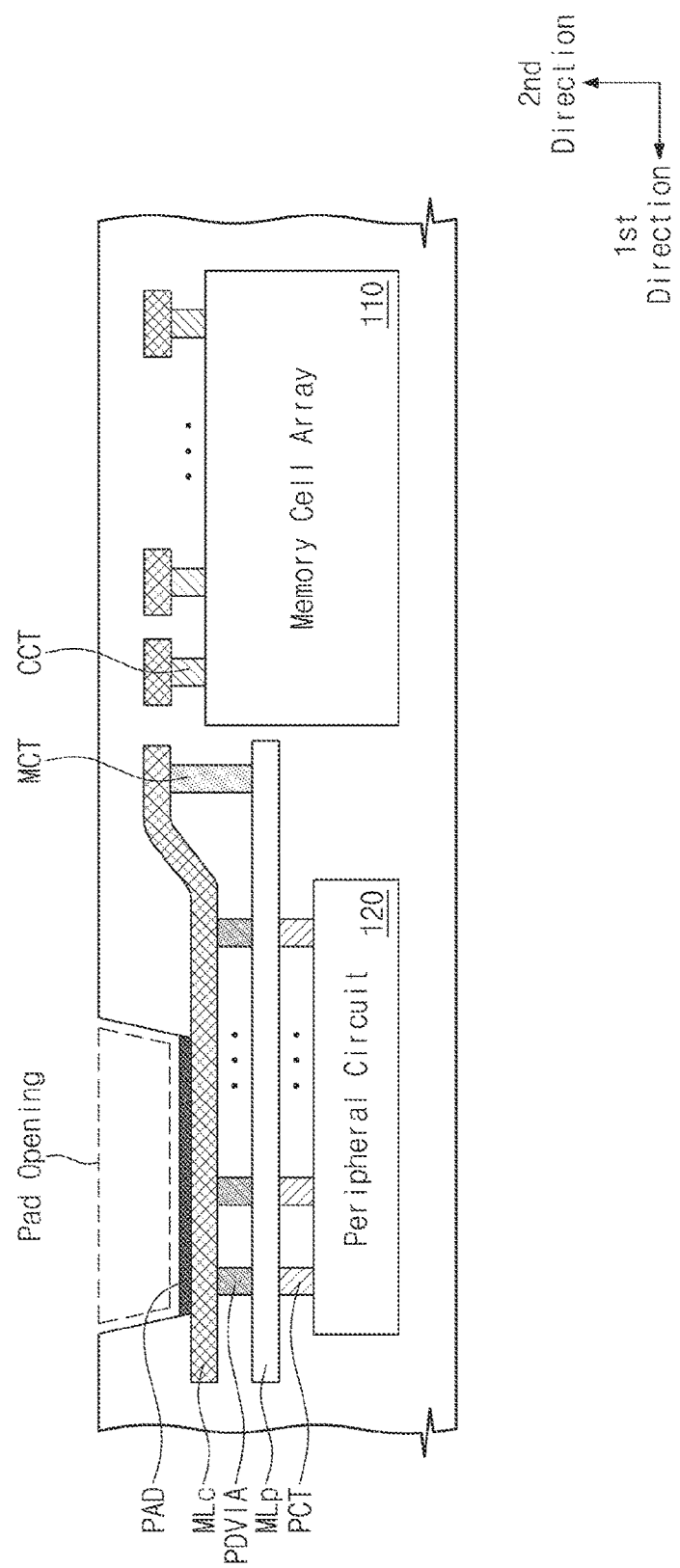
FIG. 13 is a cross-sectional view of a portion of the chip of FIG. 11 having another example of a pad opening according to the inventive concept.

FIG. 13 illustrates another example of a pad opening in this embodiment of a nonvolatile memory device according to the inventive concept. Referring to FIG. 13, the pad opening extends to a cell region metal layer MLc. The height of the cell region metal layer MLc, from a substrate, e.g., a common substrate of the memory cell array 110 and peripheral circuit 120, varies.

For example, the part of the cell region metal layer MLc under the pad is disposed at a level in the device lower than that at which the part of the cell region metal layer MLc on memory cell array 110 is disposed. The part of the cell region metal layer MLc disposed under the pad is connected with the peripheral region metal layer MLp through pad vias PDVIA. In this case, the distance between the pad and a peripheral circuit 120 is relatively small, such that resistance and capacitance between the pad and the peripheral circuit 120 are minimized Otherwise, the cell region metal layer MLc and peripheral region metal layer MLp are substantially the same as those shown in FIGS. 11 and 12.

Figure 14:
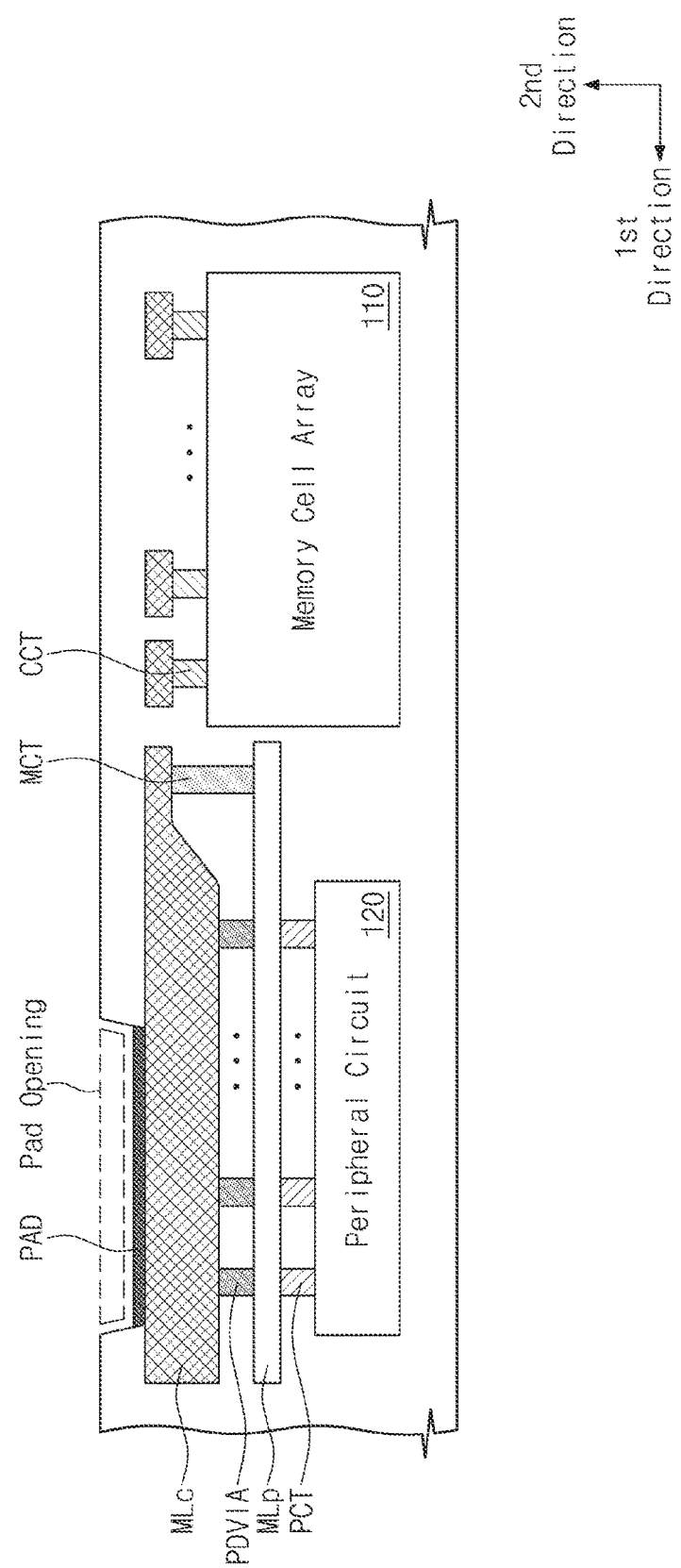
FIG. 14 is a cross-sectional view of a portion of the chip of FIG. 11 having still another example of a pad opening according to the inventive concept.

FIG. 14 illustrates another example of a pad opening in this embodiment of a nonvolatile memory device according to the inventive concept. Referring to FIG. 14, the pad opening extends to a cell region metal layer MLc. The thickness of the cell region metal layer MLc varies.

For example, the thickness of that part of the cell region metal layer MLc under the pad is thicker than that part of the cell region metal layer MLc disposed on memory cell array 110. The part of the cell region metal layer MLc under the pad is connected with the peripheral region metal layer MLp through pad vias PDVIA. Thus, resistance and capacitance between the pad and the peripheral circuit 120 may be minimized Otherwise, the cell region metal layer MLc and peripheral region metal layer MLp are substantially the same as those shown in FIGS. 11 and 12.

Figure 15:
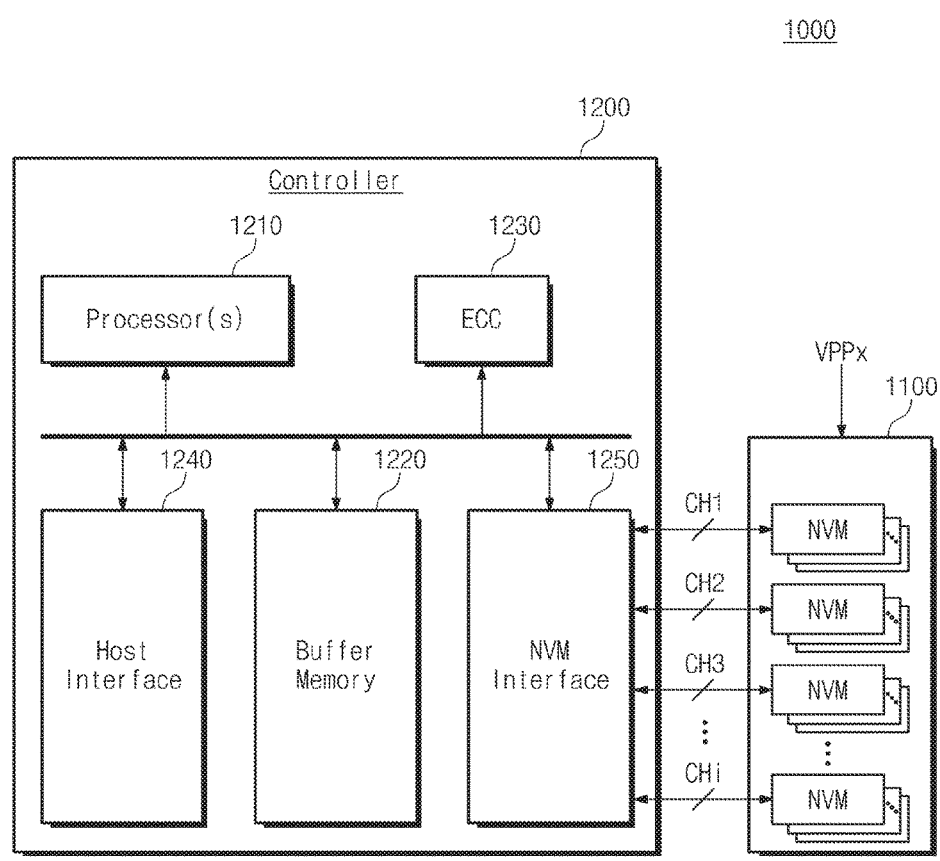
FIG. 15 is a block diagram of a solid state drive according to the inventive concept.

FIG. 15 illustrates an example of a solid state drive to which the inventive concept is applied. Referring to FIG. 15, the solid state drive (hereinafter, referred to as SSD) 1000 includes a plurality of nonvolatile memory devices 1100 and an SSD controller 1200.

The nonvolatile memory devices 1100 are configured to be optionally provided with an external high voltage VPPx. Each of the nonvolatile memory devices 1100 may have a pad and a peripheral circuit exhibiting minimal resistance and capacitance, according to any of the examples described with reference to FIGS. 1 through 14. Thus, the nonvolatile memory devices 1100 may operate at high speeds.

The SSD controller 1200 is connected to the nonvolatile memory devices 1100 through a plurality of channels CH1 through CHi (i being an integer of 2 or more). The SSD controller 1200 includes one or more processors 1210, a buffer memory 1220, an ECC block 1230, a host interface 1250, and a nonvolatile memory interface 1260.

The buffer memory 1220 temporarily stores data needed to drive the SSD controller 1200. In exemplary embodiments, the buffer memory 1220 may include a plurality of memory lines each of which stores data or a command.

The ECC block 1230 is configured to calculate an ECC value of data to be programmed at a write operation, correct an error of read data according to an ECC value at a read operation, and correct an error of data restored from the nonvolatile memory device 1100 at a data restoration operation. Although not shown in FIG. 20, a code memory may be provided to store code data needed to drive the SSD controller 1200. The code memory may be embodied as a nonvolatile memory device.

The host interface 1250 provides an interface with an external device. The host interface 1250 may be a NAND flash interface. Furthermore, the host interface 1250 may be embodied as any one of various types of interfaces or as a plurality of interfaces. The nonvolatile memory interface 1260 provides an interface with the nonvolatile memory devices 1100.

Figure 16:
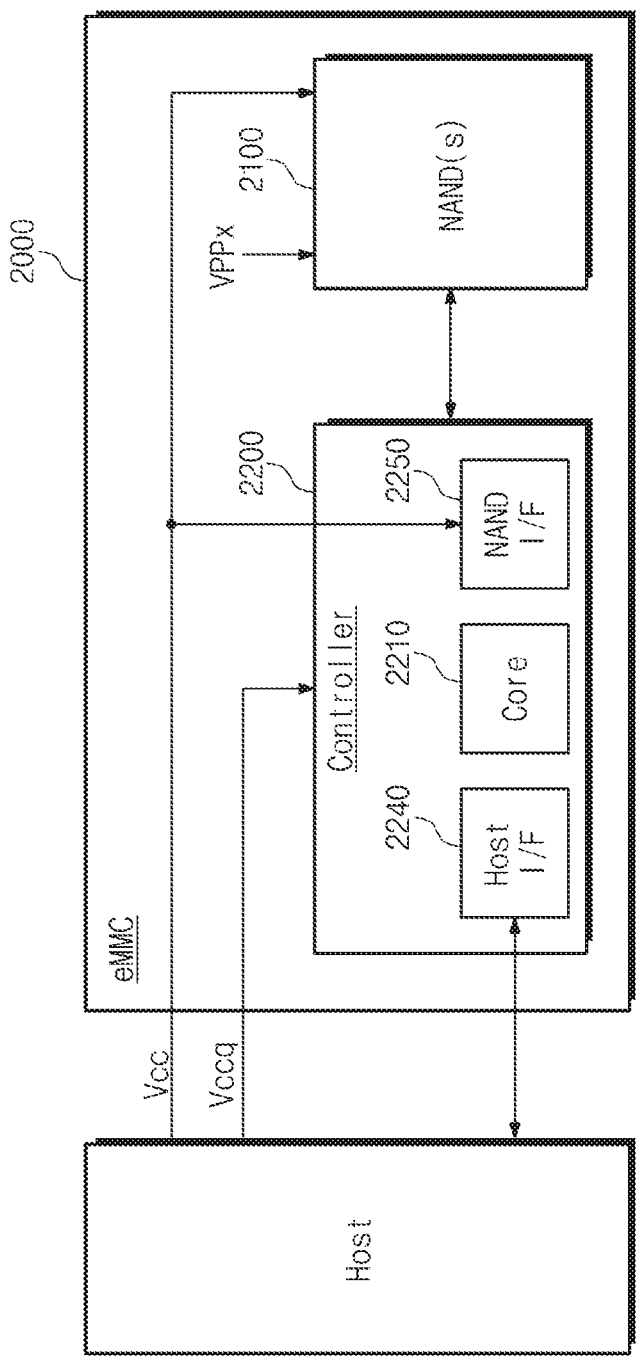
FIG. 16 is a block diagram of an eMMC according to the inventive concept.

FIG. 16 illustrates an example of an eMMC to which the inventive concept is applied. Referring to FIG. 16, an eMMC 2000 includes one or more NAND flash memory devices 2100 and a controller 2200.

The NAND flash memory device 2100 may be a single data rate (SDR) or a double data rate (DDR) NAND. Alternatively, the NAND flash memory device 2100 may be a vertical NAND flash memory device (vertical NAND (VNAND)). The NAND flash memory device 2100 may have a pad and a peripheral circuit exhibiting minimal resistance and capacitance, according to any of the examples described with reference to FIGS. 1 through 14. Thus, the NAND flash memory device 2100 may operate at a high speed.

The controller 2200 is connected to the NAND flash memory device 2100 via a plurality of channels. The controller 2200 includes one or more controller cores 2210, a host interface 2240, and a NAND interface 2250. The controller core 2210 may control an overall operation of the eMMC 2000. The host interface 2240 is configured to provide an interface between the controller 2200 and a host. The NAND interface 2250 is configured to provide an interface between the NAND flash memory device 2100 and the controller 2200. In exemplary embodiments, the host interface 2250 may be a parallel interface (e.g., MMC interface). In other exemplary embodiments, the host interface 2240 of the eMMC 2000 may be a serial interface (e.g., UHS-II, UFS interface, or the like.).

The eMMC 2000 receives power supply voltages Vcc and Vccq from the host. In this respect, the power supply voltage Vcc (e.g., about 3.3 V) may be supplied to the NAND flash memory device 2100 and the NAND interface 2260, and the power supply voltage Vccq (e.g., about 1.8 V/3.3 V) may be supplied to the controller 2200. In exemplary embodiments, the eMMC 2000 may be optionally supplied with an external high voltage.

Figure 17:
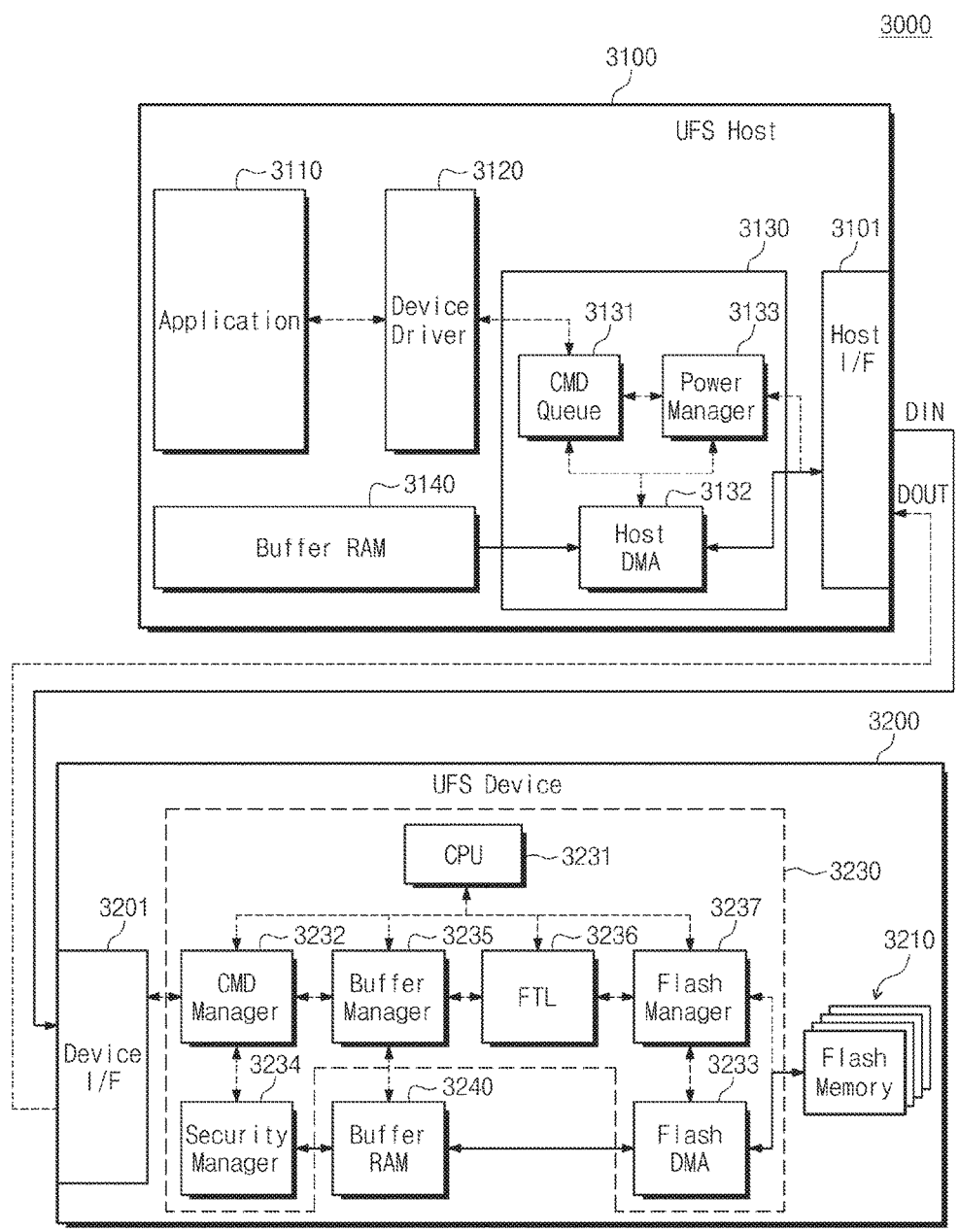
FIG. 17 is a block diagram of a UFS system according to the inventive concept.

FIG. 17 illustrates an embodiment of a UFS system to which the inventive concept is applied. Referring to FIG. 17, UFS system 3000 includes a UFS host 3100 and a UFS device 3200.

The UFS host 3100 includes an application 3110, a device driver 3120, a host controller 3130, and a buffer RAM 3140. The host controller 3130 includes a command queue 3131, a host DMA 3132, and a power manager 3133. The command queue 3131, host DMA 3132, and power manager 3133 may be algorithm, software, or firmware that is executed in the host controller 3130.

Commands (e.g., a write command) generated by the UFS application 3110 and the device driver 3120 in the UFS host 3100 are managed by the command queue 3131 of the host controller 3130. The command queue 3131 sequentially manages commands to be provided to the UFS device 3200. Provided to the host DMA 3132 are the commands that are stored in the command queue 3131. The host DMA 3132 sends the commands to the UFS device 3200 through a host interface 3101.

The UFS device 3200 includes a flash memory 3210, a device controller 3230, and a buffer RAM 3240. The device controller 3230 includes a Central Processing Unit (CPU) 3231, a command manger 3232, a flash DMA 3233, a security manager 3234, a buffer manager 3235, a flash translation layer (FTL) 3236, and a flash manager 3237. In this respect, the command manager 3232, security manager 3234, buffer manager 3235, FTL 3236, and flash manager 3237 may be algorithm, software, or firmware that operates in the device controller 3230.

The flash memory device 3210 may have a pad and a peripheral circuit exhibiting minimal resistance and capacitance, according to any of the examples described with reference to FIGS. 1 through 14. Thus, the flash memory device 3210 may operate at a high speed.

A command transferred from the UFS host 3100 to the UFS device 3200 is provided to the command manager 3232 through a device interface 3201. The command manager 3232 analyzes a command provided from the UFS host 3100, and it authenticates the command by means of the security manager 3234. The command manager 3232 allocates the buffer RAM 3240 so as to receive data through the buffer manager 3235. Being ready to transfer data, the command manager 3232 sends RTT (READY_TO_TRANSFER) UPIU to the UFS host 3100.

The UFS host 3100 sends data to the UFS device 3200 in response to the RTT UPIU. The data is sent to the UFS device 3200 through the host DMA 3132 and the host interface 3101. The UFS device 3200 stores the received data in the buffer RAM 3240 through the buffer manager 3235. The data stored in the buffer RAM 3240 is provided to the flash manger 3237 through the flash DMA 3233. The flash manager 3237 stores data at a selected address of the flash memory 3210, based on address mapping information of the FTL 3236.

If a data transfer operation and a program operation for a command are completed, the UFS device 3200 may send a response signal to the UFS host 3100 through an interface and may inform the UFS host 3100 of command completion. The UFS host 3100 informs the device driver 3120 and the application 3110 of whether a command corresponding to the response signal is processed, and then terminates an operation on the command.

Figure 18:
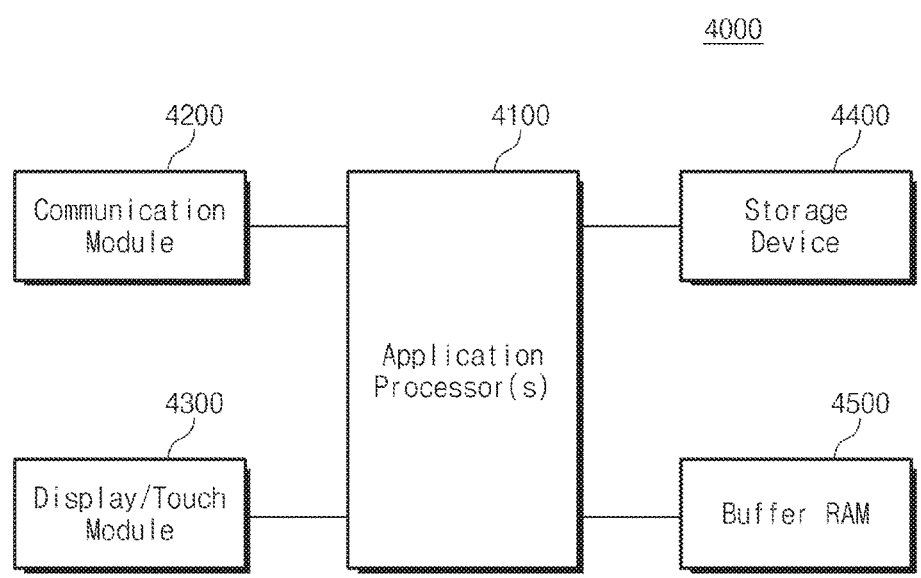
FIG. 18 is a block diagram of a mobile device according to the inventive concept.

FIG. 18 illustrates a mobile device to which the inventive concept is applied. Referring to FIG. 18, mobile device 4000 includes an application processor 4100, a communication module 4200, a display/touch module 4300, a storage device 4400, and a mobile RAM 4500.

The application processor 4100 controls an overall operation of the mobile device 4000, and the communication module 4200 performs wireless/wire communications with an external device. The display/touch module 4300 is configured to display data processed by the application processor 4100 or to receive data through a touch panel. The storage device 4400 is configured to store user data. The storage device 4400 may be, but is not limited to, an eMMC, an SSD, or a UFS device. The mobile RAM 4500 temporarily stores data needed for an operation of the mobile device 4000.

The storage device 4400 may have a pad and a peripheral circuit exhibiting minimal resistance and capacitance, according to any of the examples described with reference to FIGS. 1 through 14. Thus, the storage device 4400 may operate at a high speed.

Embodiments of the inventive concept may be realized in the form of any of a variety of different semiconductor device packages. Examples of such packages include PoP (Package on Package), Ball grid array (BGA), Chip scale packages (CSP), Plastic Leaded Chip Carrier (PLCC), Plastic Dual In-Line Package (PDIP), Die in Waffle Pack, Die in Wafer Form, Chip On Board (COB), Ceramic Dual In-Line Package (CERDIP), Plastic Metric Quad Flat Pack (MQFP), Small Outline (SOIC), Shrink Small Outline Package (SSOP), Thin Small Outline (TSOP), Thin Quad Flatpack (TQFP), System In Package (SIP), Multi Chip Package (MCP), Wafer-level Fabricated Package (WFP), and Wafer-Level Processed Stack Package (WSP).

Finally, embodiments of the inventive concept and examples thereof have been described above in detail. The inventive concept may, however, be embodied in many different forms and should not be construed as being limited to the embodiments described above. Rather, these embodiments were described so that this disclosure is thorough and complete, and fully conveys the inventive concept to those skilled in the art. Thus, the true spirit and scope of the inventive concept is not limited by the embodiment and examples described above but by the following claims.

What is claimed is:

1. A nonvolatile memory device, comprising:
a memory cell array including a plurality of memory cells;
a first metal layer;
a plurality of cell region interconnections electrically connecting the first metal layer and the memory cell array;
a peripheral circuit configured to control the memory cell array;
a second metal layer on the peripheral circuit;
a peripheral region interconnection electrically connecting the peripheral circuit and the plurality of cell region interconnections; and
a pad on the first metal layer and dedicated for use in exchanging data, an address, or a command with the peripheral circuit,
wherein the device has an upper surface and an opening extending therein from the upper surface,
the first metal layer includes a cell array region and a pad region,
the first metal layer has a contiguous bottom surface portions of which constitute the cell array region and the pad region, respectively;
the cell array region is disposed on the memory cell array,
the pad is disposed at the bottom of the opening on the pad region of the first metal layer so as to be recessed in the device, and
the portion of the bottom surface which constitutes the pad region of the first metal layer occupies a level in the device different from that occupied by the portion of the bottom surface which constitutes the cell array region of the first metal layer.

2. A nonvolatile memory device, comprising:
a memory cell array including a plurality of memory cells;
a first metal layer;
a plurality of cell region interconnections electrically connecting the first metal layer and the memory cell array;
a peripheral circuit configured to control the memory cell array;
a second metal layer on the peripheral circuit;
a peripheral region interconnection electrically connecting the peripheral circuit and the plurality of cell region interconnections; and
a pad on the first metal layer and dedicated for use in exchanging data, an address, or a command with the peripheral circuit, wherein the first metal layer includes a cell array region and a pad region, the first metal layer has a contiguous bottom surface portions of which constitute the cell array region and the pad region, respectively;

the cell array region is disposed on the memory cell array, the pad is disposed on the pad region of the first metal layer, and the portion of the bottom surface which constitutes the pad region of the first metal layer is disposed at a level in the device lower than that at which the portion of the bottom surface which constitutes the cell region of the first metal layer is disposed.

3. The nonvolatile memory device of claim 1, wherein the pad region of the first metal layer is thicker than the cell array region of the first metal layer.

4. The nonvolatile memory device of claim 1, further comprising a plurality of pad vias connecting the pad region of the first metal layer to the second metal layer.

5. The nonvolatile memory device of claim 1, and comprising a plurality of conductive paths connecting the first metal layer to the second metal layer.

6. The nonvolatile memory device of claim 1, wherein the memory cell array is stacked on the peripheral circuit.

7. The nonvolatile memory device of claim 1, wherein the pad is located at a level below the portion of the bottom surface which constitutes the cell region of the first metal layer.

8. A nonvolatile memory device, comprising:
a memory cell array including a plurality of memory cells;
a first metal layer;
a plurality of cell region interconnections electrically connecting the first metal layer and the memory cell array;
a peripheral circuit configured to control the memory cell array;
a second metal layer on the peripheral circuit;
a peripheral region interconnection electrically connecting the peripheral circuit and the plurality of cell region interconnections; and
a pad on the first metal layer and dedicated for use in exchanging data, an address, or a command with the peripheral circuit,
wherein the first metal layer includes a cell array region and a pad region,
the first metal layer has a contiguous bottom surface portions of which constitute the cell array region and the pad region, respectively;
the cell array region is disposed on the memory cell array,
the pad is disposed on the pad region of the first metal layer,
the portion of the bottom surface which constitutes the pad region of the first metal layer occupies a level in the device different from that occupied by the portion of the bottom surface which constitutes the cell array region of the first metal layer, and
the pad region of the first metal layer has the same thickness as the cell region of the first metal layer, and the first metal layer also includes an inclined portion extending obliquely to and connecting the pad and cell regions.

* * * * *